United States Patent

Nakagawa

Patent Number: 5,726,467
Date of Patent: Mar. 10, 1998

[54] MULTIPLE NARROW-LINE-CHANNEL FET HAVING IMPROVED NOISE CHARACTERISTICS

[75] Inventor: Yoshikazu Nakagawa, Kyoto, Japan

[73] Assignee: Rohm Co., Ltd., Kyoto, Japan

[21] Appl. No.: 954,908

[22] Filed: Sep. 30, 1992

[30] Foreign Application Priority Data

Oct. 21, 1991 [JP] Japan ................................. 3-302281

[51] Int. Cl.$^6$ .................... H01L 31/0328; H01L 31/0336
[52] U.S. Cl. ................................ 257/192; 257/194
[58] Field of Search ............... 257/20, 29, 192, 257/27, 22

[56] References Cited

U.S. PATENT DOCUMENTS

| 4,021,789 | 5/1977 | Furman et al. | 307/279 |
| 4,796,068 | 1/1989 | Katayama et al. | 257/194 |

FOREIGN PATENT DOCUMENTS

| 8803328 | 5/1988 | WIPO . |
| WO88/03328 | 5/1988 | WIPO . |

OTHER PUBLICATIONS

European Search Report dated Apr. 15, 1993 in Application No. EP 92 11 7924.

*Primary Examiner*—Wael Fahmy
*Attorney, Agent, or Firm*—Brumbaugh, Graves, Donohue & Raymond

[57] ABSTRACT

Insulating layers are formed, for instance, by ion injection, in a multilayer of compound semiconductor layers in regions spaced at predetermined intervals, to leave a plurality of narrow channel layers between the insulating layers. A gate electrode is formed on the insulating layers and channel layers so as to traverse those layers.

3 Claims, 4 Drawing Sheets

MULTIPLE NARROW-LINE-CHANNEL FET HAVING IMPROVED NOISE CHARACTERISTICS

BACKGROUND OF THE INVENTION

The present invention relates to a multiple narrow-line-channel FET and a manufacturing method therefor.

One-dimensional devices are now being developed as next generation devices succeeding MESFETs and HEMTs (high electron mobility transistors) in which electrons have degrees of freedom of three and two, respectively with respect to their movement. Among such one-dimensional-channel devices, a multiple narrow-line-channel FET is known.

As shown in FIG. 5, the multiple narrow-line-channel FET has a plurality of narrow-line channels 24a–24c called "stripes" between a source 21 and a drain 23. A flow of electrons (i.e., a current) in those channels 24a–24c is controlled by a voltage applied to a gate electrode 22. Due to its one-dimensional nature of electron transport, the multiple narrow-line-channel FET is expected to have a large electron mobility.

FIG. 6 is a sectional view taken along line 6—6' in FIG. 5. As is understood from FIG. 6, an electric field acting on the channels 24a–24c from their side faces has an effect of confining electrons within each of the channels 24a–24c. Therefore, it is also expected that the short-channel effect will be overcome. (The short-channel effect is a phenomenon in which it becomes difficult to control a very small current flowing from the source to drain by the gate voltage.)

In FIG. 6, reference numeral 25 represents a GaAs substrate; 26, undoped GaAs layer; 27, n$^+$-type AlGaAs layer; 28, n$^+$-type GaAs layer; and 29, electrons.

However, since the above conventional multiple narrow-line-channel FET has gate metal at the sides of each channel (stripe), the gate capacitance increases by a capacitance due to depletion layers extending from the side faces of the channels, so that the noise characteristics are deteriorated as described below. The noise figure NF is given by the following equation:

$$NF = 1 + K(f/f_T)\sqrt{g_m(R_s + R_g)} \quad (1)$$

where K: fitting constant, f: frequency, $f_T$: cutoff frequency, $g_m$: transconductance, $R_s$: source resistance, and $R_g$: gate resistance. The cutoff frequency $f_T$ is expressed as:

$$f_T = g_m/2\pi C_{gs},$$

and the capacitance due to the depletion layer increases a gate-source capacitance $C_{gs}$. As a result, the cutoff frequency $f_T$ is decreased, and the noise figure NF is increased as is understood from equation (1).

SUMMARY OF THE INVENTION

The present invention has been made in view of the above problem in the art, and has an object of reducing a capacitance at side faces of channels of a multiple narrow-line-channel FET having one-dimensional channels, to thereby improve its noise characteristics.

According to the invention, a multiple narrow-line-channel FET comprises:

a plurality of compound semiconductor layers having a multilayer structure;

a plurality of first insulating layers formed in the compound semiconductor layers at predetermined intervals;

a plurality of channel layers formed between the first insulating layers;

a gate electrode formed on the first insulating layers and the channel layers so as to traverse those layers; and source and drain electrodes formed on both sides of the gate electrode.

According to the invention, a manufacturing method of a multiple narrow-line-channel FET comprises the steps of:

forming sequentially a plurality of compound semiconductor layers;

injecting ions into the compound semiconductor layers in areas spaced from each other at predetermined intervals to form a plurality of ion-injected insulating layers and to leave a plurality of channel layers between the ion-injected insulating layers;

forming a gate metal electrode on the ion-injected insulating layers and the channel layers so as to traverse those layers; and forming source and drain metal electrodes on both sides of the gate metal electrode.

Further, according to the invention, a manufacturing method of a multiple narrow-line-channel FET comprises the steps of:

forming sequentially a plurality of compound semiconductor layers;

mesa-etching the compound semiconductor layers to form a plurality of recesses spaced from each other at predetermined intervals and to leave a plurality of channel layers between the recesses;

filling the recesses by an insulating material to form a plurality of first insulating layers;

forming a gate metal electrode on the first insulating layers and the channel layers so as to traverse those layers; and forming source and drain metal electrodes on both sides of the gate metal electrode.

DESCRIPTION OF THE PREFERRED EMBODIMENTS

Figure 1:
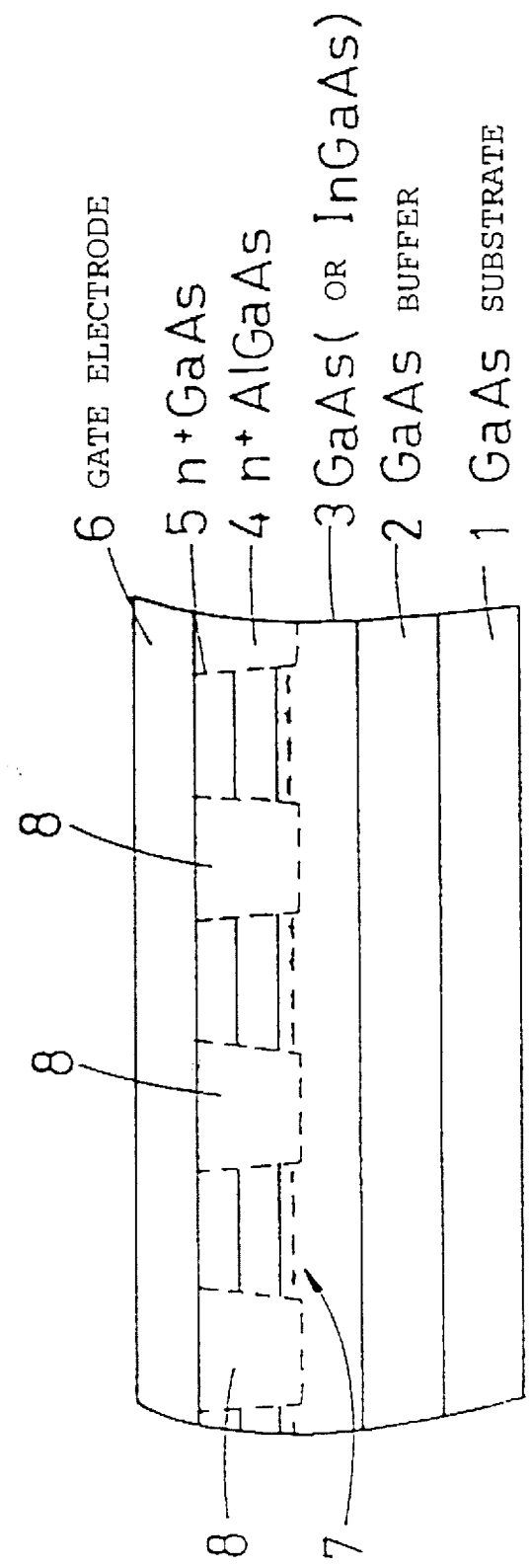
FIG. 1 is a sectional view of a multiple narrow-line-channel FET according to a first embodiment of the present invention.

FIG. 1 is a sectional view of a multiple narrow-line-channel FET according to a first embodiment of the present invention. In the figure, reference numeral 1 represents a GaAs substrate; 2, GaAs buffer layer; 3, GaAs (or InGaAs) layer; 4, n⁺-type AlGaAs layer (or n⁺-type AlInGaAs layer); 5, n⁺-type GaAs layer; 6, gate electrode of aluminum etc. The main features of this embodiment are that ion-injected insulating layers 8 are formed at predetermined intervals (not necessarily at the same intervals) to restrict channels (stripes) 7, and that the gate electrode 6 is formed on the channels 7 and ion injection layers 8. The width of each stripe 7 is selected to be within the rage of 100–800 Å, as a result of which each channel 7 can be regarded as one-dimensional.

Since there exists no gate metal at the sides of each channel 7, almost no depletion layer develops from its side faces unlike the conventional case. As a result, the gate-source capacitance $C_{gs}$ does not take an unduly large value, and the noise figure NF is reduced.

Figure 2A:
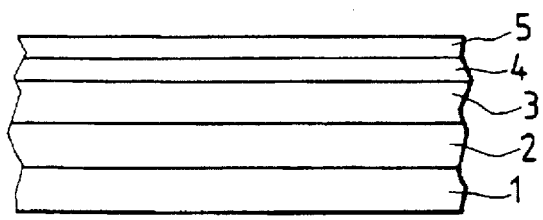
FIG. 2(a) is a sectional view showing a manufacturing method of the FET of FIG. 1.
Figure 2B:
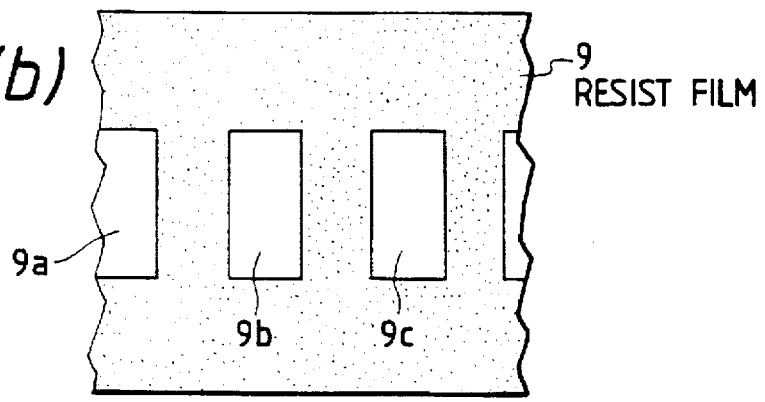
FIGS. 2(b)–2(d) are plan views showing the manufacturing method of the FET of FIG. 1.

FIGS. 2(a)–2(d) illustrate a manufacturing method of the FET of FIG. 1. First, as shown in FIG. 2(a), a GaAs buffer layer 2, a GaAs (or InGaAs) layer 3, an n⁺-type AlGaAs layer (or n⁺-type AlInGaAs layer) 4 and an n⁺-type GaAs layer 5 are sequentially formed on a GaAs substrate 1. Then, as shown in FIG. 2(b), a resist film 9 having openings 9a–9c are formed on the n⁺-type GaAs layer 5. Ions of, e.g., oxygen, hydrogen or boron are injected via the resist film 9.

Figure 2C:
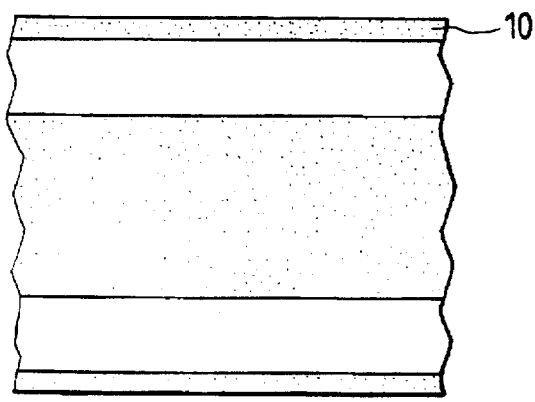

After removing the resist film 9, ohmic contact metal for the source and drain electrodes is deposited by evaporation via a pattern 10 as shown in FIG. 2(c), and then the pattern 10 is lifted off. Then, another pattern for a gate electrode 6 is formed. After gate metal (e.g., Al, Ti/Pt/Au and WSi/Au) is deposited by evaporation, the pattern is lifted off. Recess etching for the gate electrode 6 may be performed additionally.

Figure 2D:
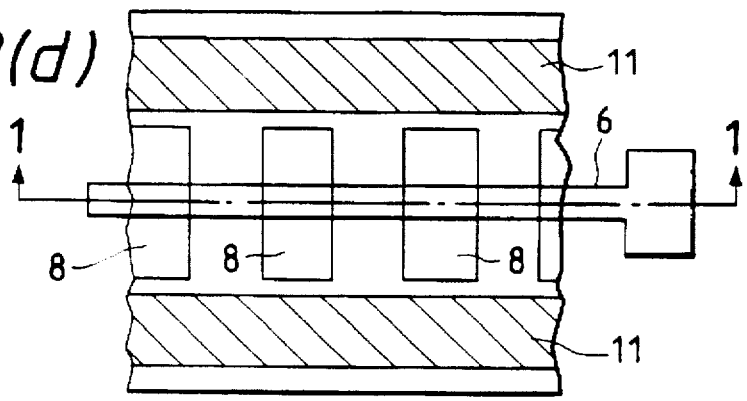

In this manner, an FET as shown in FIG. 2(d) is produced. FIG. 1 is a sectional view taken along line 1—1' in FIG. 2(d). In FIG. 2(d), reference numeral 11 represents the ohmic contact metal for the source and drain electrodes.

Figure 3:
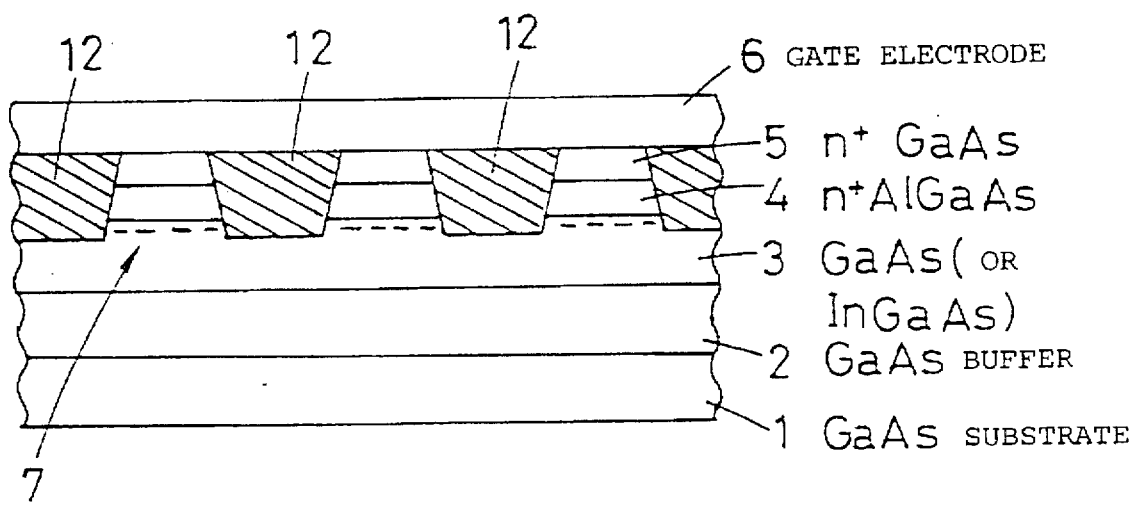
FIG. 3 is a sectional view of a multiple narrow-line-channel FET according to a second embodiment of the invention.

FIG. 3 shows a second embodiment of the invention, in which insulator layers 12 are provided instead of the ion injection layers 8 of FIG. 1. The remaining constitution is the same as the first embodiment of FIG. 1. The insulator layers 12 may be made of $SiO_2$, silicon nitride, alumina, etc.

The FET of FIG. 3 is manufactured as follows. First, the semiconductor layers 1–5 are formed on the GaAs substrate 1 by epitaxial growth as in the case of FIG. 2(a). Next, mesa-etching is performed using the resist film 9 of FIG. 2(b) as a mask. Using the same mask, an insulator film (e.g., a nitride film) is deposited at a low temperature into recesses formed by the mesa-etching. This deposition of the insulator film can be performed with a CVD apparatus that uses a microwave. Then, the resist layer 9 and the insulator film deposited thereon are removed by a lift-off process. Thereafter, the processes of FIGS. 2(c) and 2(d) are performed.

Figure 4:
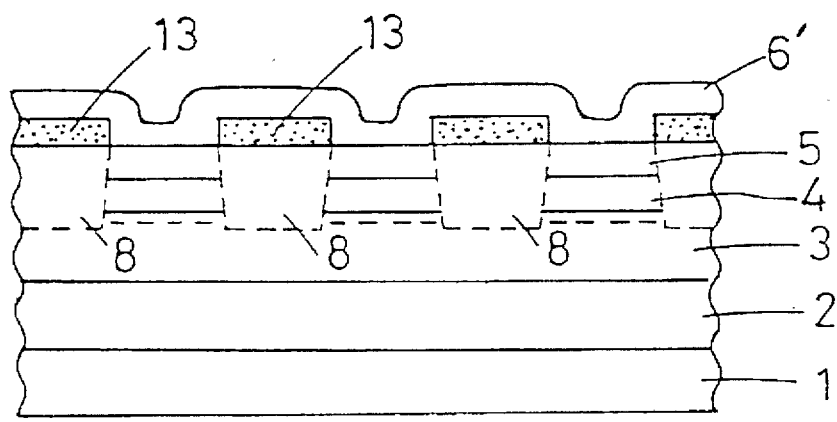
FIG. 4 is a sectional view of a multiple narrow-line-channel FET according to a third embodiment of the invention.
Figure 5:
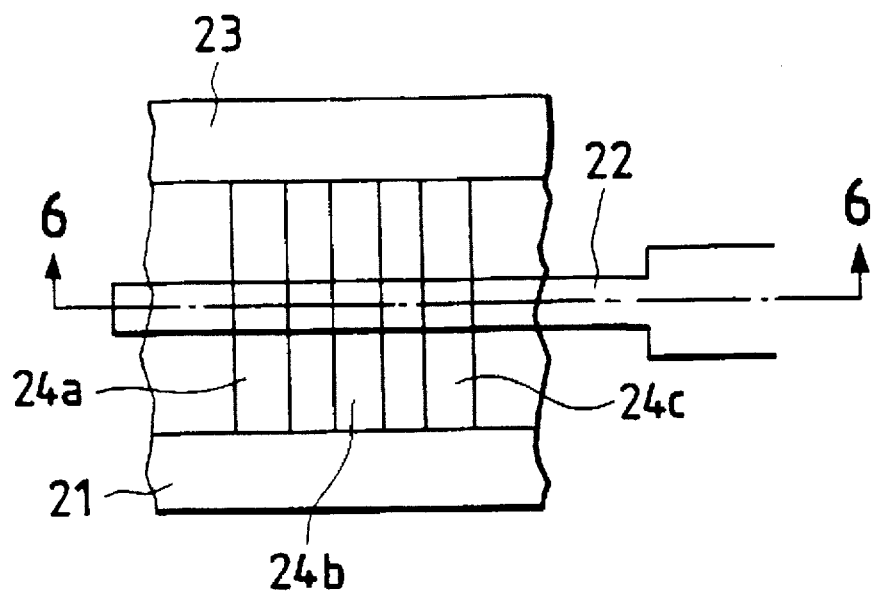
FIG. 5 is a plan view of a conventional multiple narrow-line-channel FET.
Figure 6:
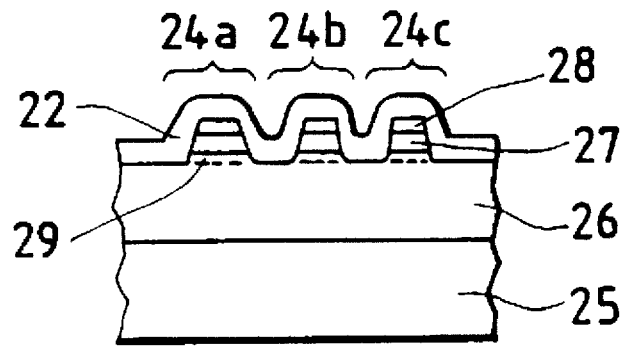
FIG. 6 is a sectional view taken along line 6—6' in FIG. 5.

FIG. 4 shows a third embodiment of the invention. In the third embodiment, first the ion injection layers 8 are formed in the same manner as the first embodiment of FIG. 1, then insulator layers 13 are formed on the respective ion injection layers 8 so as to project upward, and finally a gate electrode 6' is formed on the surface that includes the insulator layers 13.

A production method for the FET of the third embodiment can be the same as first embodiment until formation of the injection layers 8. Thereafter, an insulator film is deposited and partially removed by a lift-off process. The gate electrode 6' may be formed by the process of FIG. 2(d).

In the third embodiment of FIG. 4, the insulator layers 13 may be formed on the insulator layers 12 of FIG. 3, instead of the injection layers 8 of FIG. 1. (The insulator layers 12 is formed by depositing an insulating material into the mesa-etched recesses.)

In each of the above embodiments, thicknesses of the semiconductor layer (GaAs or InGaAs layer) 3 and the semiconductor layer (n⁺-type AlGaAs layer or n⁺-type AlInGaAs layer) 4 are selected to be 80–160 Å and 200–400 Å, respectively.

As described above, according to the invention, since there exists no gate metal at the sides of the channels, almost no depletion layer develops from the side faces of each channel. As a result, the gate capacitance can be reduced as much, and high-quality, i.e., low-noise multiple narrow-line-channel FET can be realized.

What is claimed is:

1. A multiple narrow-line-channel FET, comprising:

a plurality of compound semiconductor layers of different compositions having a multilayer structure;

a plurality of first insulating layers formed in the compound semiconductor layers at predetermined intervals;

a plurality of channel layers formed between the first insulating layers;

a gate electrode formed on the first insulating layers and the compound semiconductor layers so as to traverse those layers; and source and drain electrodes formed on both sides of the gate electrode.

2. The multiple narrow-line-channel FET of claim 1, wherein the first insulating layers are ion-injection layers.

3. The multiple narrow-line-channel FET of claim 1, further comprising a plurality of second insulating layers formed between the gate electrode and the respective first insulating layers so as to protrude from the compound semiconductor layers.

* * * * *